United States Patent [19]

Subramanian

[11] 3,839,687

[45] Oct. 1, 1974

[54] SURFACE WAVE FILTER AND METHOD

[75] Inventor: Sundaram Subramanian, Evanston, Ill.

[73] Assignee: Zenith Radio Corporation, Chicago, Ill.

[22] Filed: Nov. 20, 1972

[21] Appl. No.: 307,887

[52] U.S. Cl. .................... 333/72, 310/9.8, 333/30 R
[51] Int. Cl. ........................... H03h 9/30, H03h 9/32
[58] Field of Search .............. 333/72, 30 R; 310/9.7, 310/9.8

[56] References Cited

OTHER PUBLICATIONS

Toda et al.–"Surface Wave Delay Lines with Interdigital Transducers on PZT Ceramic Plates" in Japanese Journal of Applied Physics, Vol. 10, No. 6, June 1971; pages 671–677

Smith et al.–"Analysis of Interdigital Surface Wave Transducers by use of an Equivalent Circuit Model" in IEE Trans. on Microwave Theory and Techniques, Nov. 1969, pages 856–861 de Klerk–Ultrasonic Transducers–Ultrasonics, January 1971; p. 35–38

*Primary Examiner*—James W. Lawrence
*Assistant Examiner*—Marvin Nussbaum
*Attorney, Agent, or Firm*—Nicholas A. Camasto; John H. Coult; John J. Pederson

[57] ABSTRACT

This disclosure depicts acoustic surface wave devices adapted for use in a television receiver which include one or more surface wave transducers of the interdigitated comb type comprising periodic arrays of electrically conductive fingers. The duty factor of the fingers of at least one transducer in each of the depicted devices is chosen according to prescribed guidelines to improve or control one or more device performance parameters related to the generation, reception and/or propagation of surface waves, such as wave reflection coefficient, surface wave coupling factor, surface wave velocity, or uniformity in wave reflection coefficient as a function of wave frequency. Novel methods for making such devices are also disclosed.

6 Claims, 16 Drawing Figures

SURFACE WAVE FILTER AND METHOD

BACKGROUND OF THE INVENTION

Surface wave integratable filter (SWIF) devices have become well known to practitioners in the electrical and acoustic wave arts, particularly as such devices are used to delay, filter or otherwise process electrical signals. As examples of pertinent patent literature, reference may be had to U.S. Pat. Nos. 3,582,840; 3,600,710; 3,582,837; 3,581,248; 3,559,115; 3,626,309; 3,573,673 and 3,596,211, all assigned to the assignee of the present invention.

This invention concerns SWIF devices of the one port and two port types each including at least one piezoelectric surface wave propagative medium on which is disposed one or more interdigitated comb-type electro-acoustic transducers for launching and/or receiving surface waves on the medium.

It is well known that conventional SWIF devices, offer great promise in such applications as the IF (intermediate frequency) stage of television receivers, and IF delay lines. However, a number of significant obstacles to the commercial use of such devices remain. One drawback of conventional SWIF devices concerns the undesirably large wave reflections which are produced. The high surface wave reflection coefficient of conventional SWIF devices is due in large part to the fact that conventional SWIF devices typically have a finger duty factor of 50 percent, that is, the comb fingers occupy 50 percent of each comb period. I have found that a transducer which is made on materials with low propagation loss and high coupling factor and which has a finger duty factor of 50 percent yields a relatively high wave reflection coefficient.

It is thought to be useful at this point to elaborate on the nature of wave reflections in a SWIF device and their effect on the performance of a SWIF device. The overall wave reflection characteristic of a SWIF device results from a combination of many factors. The most important factors are the wave propagation loss in the substrate, the surface wave coupling factor, the center-to-center spacing of the combs, and the film thickness of the combs.

A typical SWIF device has a finite distance between its input and output transducers. Hence, a finite time is required for an acoustic surface wave to travel along the path from the input transducer to the output transducer. At the output transducer, a part of the acoustic wave energy is converted to electrical energy and delivered to an applied load. Another part of the acoustic wave energy is transmitted past the output transducer where it is terminated or dissipated. Yet another part of the acoustic wave energy is reflected by the output transducer back along the original path toward the input transducer.

This reflected surface wave, which corresponds in frequency content to the original surface wave but is attenuated, intercepts the input transducer. A portion of this once-reflected wave is reflected a second time back along the original path to the output transducer where it is received as a diminished replica of the original wave.

Because the twice-reflected wave travels a longer path to the output transducer than does the original wave, it arrives at the output transducer later than that original wave. The time delay experienced by the twice-reflected wave is equal to twice the time period required for a surface wave to traverse the path from the input transducer to the output transducer.

When such a SWIF device is used, for example as an IF bandpass filter in a television IF amplifier, the twice-reflected signal components appear as ghosts in the displayed picture.

Known methods for solving this problem have included optimizing the signal-transducing characteristics of one or both of the input and output transducers, depositing an attenuating material between the input and the output transducers, and reducing the time delay by decreasing the spacing between the transducers. Other methods involve utilizing an additional transducer, spaced from the input and output transducers, which is responsive to a portion of the original surface wave for generating an acoustic surface wave of predetermined phase and amplitude which is subtracted from the original wave to at least partially cancel the undesired acoustic wave originally reflected back from the output transducer. See U.S. Pat. Nos. 3,559,115 and 3,596,211. The amount of improvement provided by each of the above approaches is limited and certain of the methods have significant deleterious side-effects. All have drawbacks which render them of questionable commercial value.

Conventional SWIF devices are known to also have other shortcomings, including nonuniformity of wave reflections as a function of signal frequency, noncontrollability of the propagation velocity of the surface waves with an acceptable degree of accuracy, and higher than desired insertion losses due to undesirably low surface wave coupling factors.

OBJECTS OF THE INVENTION

It is a general object of this invention to provide one port and two port surface wave integratable filter (SWIF) devices having improved performance characteristics.

It is a more specific object to provide SWIF devices having improved transducer structures which are effective to either minimize or maximize surface wave reflections, as desired.

It is a specific object to provide a SWIF device which is particularly useful in the IF stage of a television receiver having the property of improving the coupling between a low impedance tuner and a much higher impedance IF amplifier and at the same time minimizing surface wave reflections in the device.

It is another object of this invention to provide SWIF devices in which variations in wave reflection coefficient as a function of frequency are minimized.

It is yet another object to provide SWIF devices having transducer structures with greater coupling factors than prior art transducer structures, and thus to provide SWIF's having lower insertion losses than are achievable with prior art devices.

It is another object to provide improved SWIF devices in which the constructive surface wave velocity (defined below) can be predetermined with a high degree of accuracy.

It is still another object to provide improved SWIF devices in which the above described favorable characteristics and features are achieved simply by varying a design parameter of one or more transducers of a basic SWIF structure, and in which the described ends are accomplished simply, at very low cost, and generally without the necessity for adding auxiliary structures or making extensive modifications to the basic SWIF structure.

BRIEF DESCRIPTION OF THE DRAWINGS

The features of the invention which are believed to be novel are set forth with particularity in the appended claims. The invention, together with further objects and advantages thereof, may best be understood, however, by reference to the following description taken in conjunction with the accompanying drawings, in the several figures of which like reference numerals identify like elments, and in which:

DESCRIPTION OF THE PREFERRED EMBODIMENT

Figure 1:
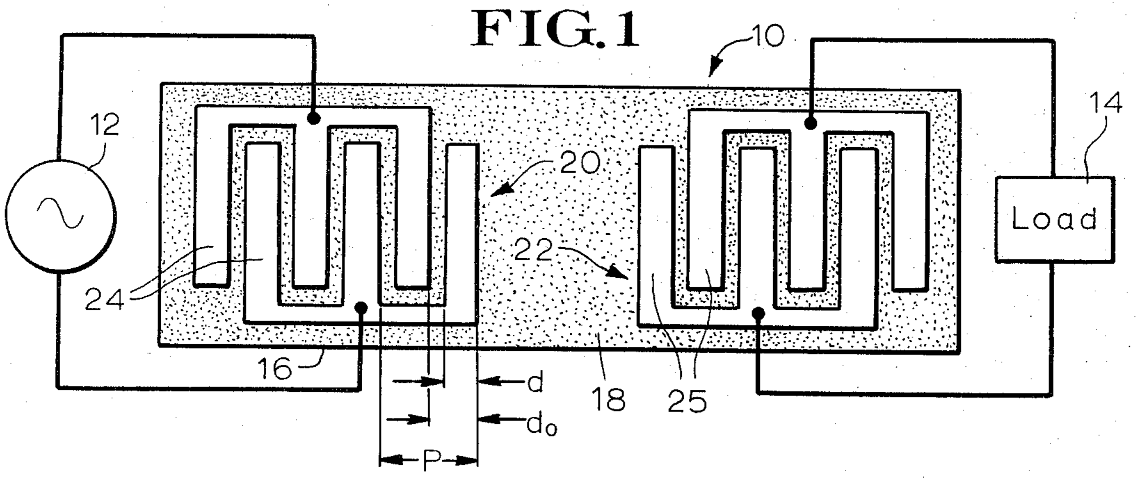
FIG. 1 is a schematic plan view of a SWIF device implementing the principles of certain aspects of this invention.

FIG. 1 illustrates a SWIF device implementing the principles of one aspect of this invention. The FIG. 1 embodiment is illustrated as comprising a SWIF (surface wave integratable filter) device 10 coupled between an input source 12 of electrical signals and an output load impedance 14. The SWIF device 10 comprises a piezoelectric surface wave propagative medium 16 having a surface 18 for propagating surface waves. The medium 16 may be selected from a variety of suitable materials such as PZT (lead zirconate titanate), lithium tantalate and lithium niobate. Lithium niobate is a preferred single crystal material at this time due to its characteristic batch-to-batch uniformity of surface wave velocity and relatively low overall losses.

The SWIF device 10 includes transmitting transducer means 20 and receiving transducer means 22 spaced on the surface 18 for respectively launching and receiving surface waves on the medium.

The transmitting and receiving transducer means 20 and 22 are illustrated as each comprising an array of spaced, interconnected, electrically conductive fingers. In the illustrated preferred embodiment, the arrays of fingers are each divided into interdigitated combs which are driven in push-pull fashion. In the depicted FIG. 1 embodiment, in the interest of clarity of illustration, the transducer means 20 and 22 are shown as each comprising single pairs of interdigitated combs. In practice it may be desirable in many applications to provide a more complex arrangement of input and output transducer structures having more than one input transducer and/or more than one output transducer, and each or all of which transducers may be of a more sophisticated construction than the comb structures illustrated schematically in FIG. 1. The fingers may be composed of such electrically conductive materials as gold or aluminum vacuum deposited on the surface 18 of the medium 16 after the surface 18 has been smoothly lapped and polished.

In operation, direct piezoelectric surface-wave transduction is accomplished by the transmitting transducer means 20. Spatially periodic electric fields are produced across the array of fingers 24 when a single from input source 12 is applied to the transducer means 20. These fields cause perturbationss or deformations of the surface 18 of the medium 16 by piezoelectric action. Efficient generation of surface waves occurs when the strain components produced by the electric fields in the piezoelectric medium 16 substantially match the strain components associated with the surface-wave mode. These mechanical perturbations travel along the surface 18 of medium 16 as generalized surface waves representative of the input signal.

The potential developed between any given pair of successive transducer fingers produces two waves traveling along the surface 18 of medium 16 in opposing directions perpendicular to the fingers. When the center-to-center distance between the fingers is one-half of the acoustic wavelength of the wave at the desired input signal frequency (the so-called center or synchronous frequency), relative maxima of the output waves are produced by piezoelectric transduction in transducer means 20. For increased selectivity, additional electrode teeth may be added to the comb patterns of transducers 20 and 22. Further modifications and adjustments are described and others are referenced in the aforementioned patents for the purpose of particularly shaping the response presented by the filter to the transmitted signal. Techniques are also mentioned in the referenced patents for attenuating or advantageously making use of the one of the two surface waves that travels to the left from transducer means 20 in FIG. 1.

It will suffice for purposes of understanding the present invention to consider only the acoustic surface waves that travel to the right from transducer means 20 in the direction toward transducer means 22. Surface waves generated by transmitting transducer means 20 are transmitted along the medium 16 to receiving transducer means 22 where they are detected by means of fingers 25 are converted to an electrical signal for transmission to a load impedance 14 connected across the interdigitated combs in receiving transducer 22.

It should be understood that the above-described principles governing the response and selectivity of the transmitting transducer means 20 apply equally to the receiving transducer means 22.

As mentioned above, not all of the acoustic energy arriving at transducer means 22 is converted to electrical energy. Part of the acoustic wave energy is reflected back along the original path. That is, when a surface wave traveling to the right from transmitting transducer 20 intercepts the receiving transducer means 22, a reflected surface wave is created. The reflected surface wave travels along a return path where a portion of it is again similarly reflected back along the propagating medium toward output (receiving) transducer means 22. Consequently, a diminished replica of the original surface wave arrives at the receiving transducer means 22 later than the original wave. The time delay of the twice-reflected wave is equal to twice the amount of time required for a surface wave to traverse the path initially from the input transducer to the output transducer. It is this diminished replica that constitutes spurious acoustic-surface-wave energy that produces undesired output signal components such as the aforementioned "ghosts."

This invention is directed to improving selected performance parameters of SWIF devices by varying the duty factor of the fingers in one or more of the transducer structures in the device. I have discovered that the duty factor of the fingers of a surface wave transducer significantly affects such performance parameters of a SWIF device as wave reflection coefficient, wave velocity, variation of wave reflection coefficient with frequency, and wave coupling factor.

For purposes of this application, the term "duty factor," $D_s$, is defined as $d/d_0 \times 100$ percent, where $d$ designates the width of each finger and $d_0$ is the finger-to-finger spacing (see FIG. 1).

In accordance with one aspect of this invention, surface wave reflections for a given load and frequency are minimized by selecting a predetermined duty factor for the fingers in the transmitting and/or receiving transducer means.

I have discovered that for a given load across the output of a SWIF device as described, and for a given frequency, the reflection coefficient of the transducer means varies over a wide range as a function of the duty factor of the transducer fingers. This discovery is exploited in accordance with this invention to minimize, or alternatively, to maximize, wave reflections in a SWIF device.

Figure 2:
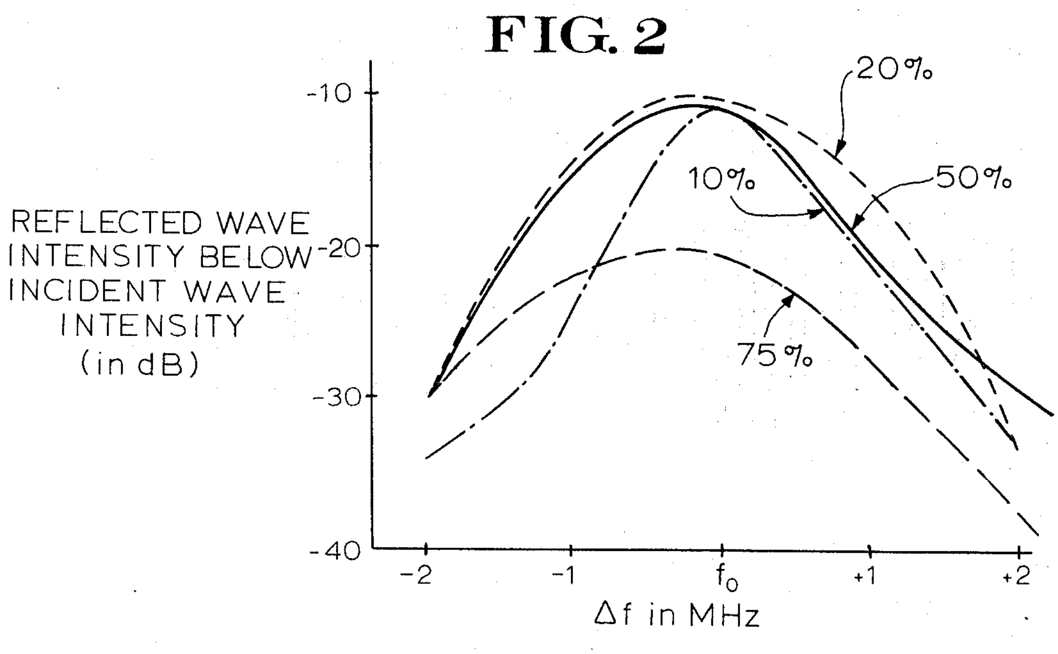
FIG. 2 is a diagram containing a family of curves illustrating the improved reflection minimization characteristics under prescribed conditions of the device shown in FIG. 1.

FIG. 2 is a diagram depicting a family of curves portraying reflected wave intensity in decibels below incident signal intensity as a function of frequency in the television IF frequency range, where $f_0$ is the center (synchronous) frequency of the transducer. The curves were developed in actual tests using lithium niobate as the wave propagative medium. The load applied across the tested transducer was relatively low, being no greater than a few ohms resistive.

Throughout this specification, the load impedance applied across a particular surface wave transducer or the driving point impedance of a particular transducer may be characterized as being relatively low or relatively high. Such characterizations are not intended to be construed with respect to an absolute impedance magnitude scale, but rather are intended to be construed in a mutually relative sense. For example, a description of a transducer load impedance as being relatively low is intended to mean the impedance of the load impedance is low relative to the driving point impedance of the associated transducer. As a second example, a description of a transducer driving impedance as being relatively high should be taken to means the impedance is high relative to the load applied thereacross.

The FIG. 1 device is illustrated as having a finger duty factor of approximately 75 percent, making it especially useful in applications wherein primarily resistive loads applied across the transmitting and receiving transducers are relatively low. In FIG. 2, one curve of the curve family depicts the variation in reflected wave intensity for a 10 percent duty factor, a second curve for a duty factor of 20 percent, a third curve for a duty factor of 50 percent, and a fourth for a duty factor of 75 percent. It can be seen that the transducer having 75 percent duty factor fingers has a substantially lower reflection characteristic throughout the tested frequency range than do the transducers with lower duty factor fingers.

Figure 3:
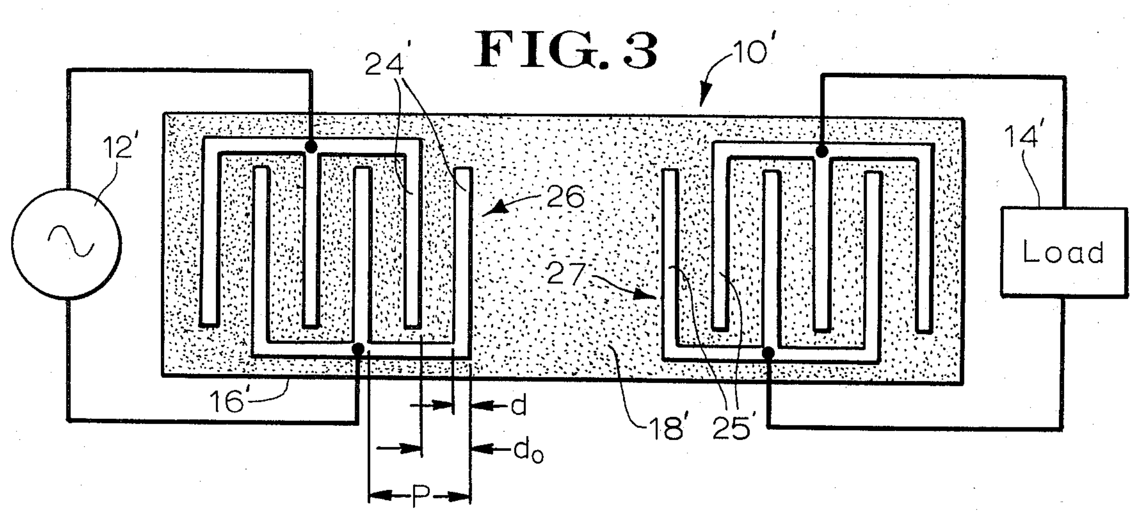
FIG. 3 is a schematic plan view of a SWIF device implementing the principles of other aspects of this invention.

FIG. 3 illustrates a SWIF device similar to the FIG. 1 device, but having transmitting and receiving transducers 26 and 27 designed to minimize surface wave reflections in applications wherein the device is coupled between relatively high input and output impedances (resistive). In FIG. 3, a structure corresponding to analogous structure in FIG. 1 is designated with primed reference numerals.

Figure 4:
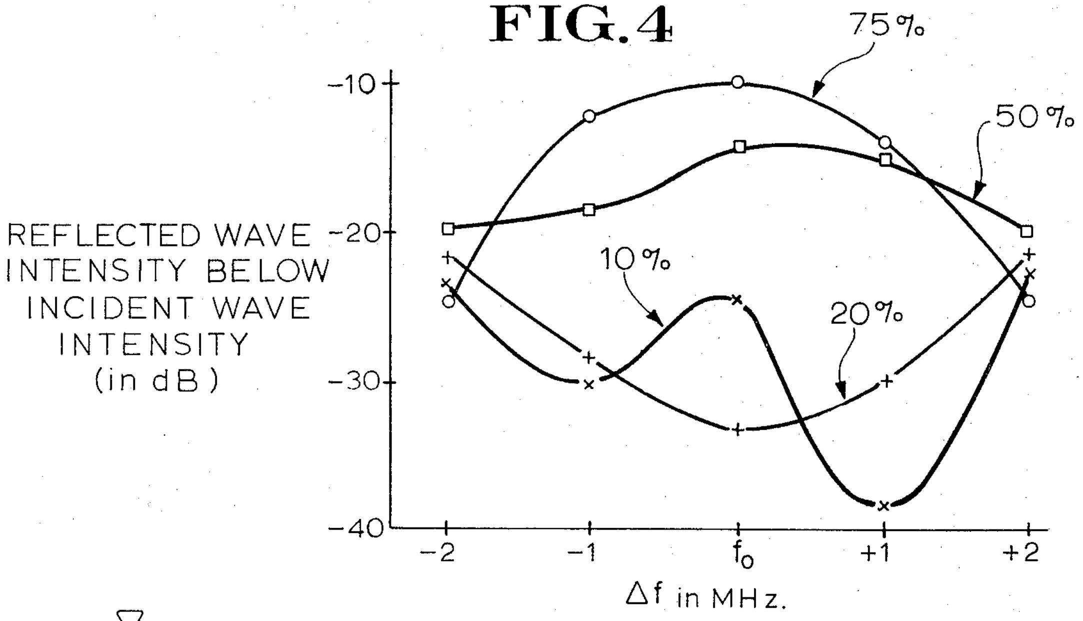
FIG. 4 is a diagram containing a family of curves which reveal the enhanced reflection minimization characteristics under prescribed conditions of the device shown in FIG. 3.

FIG. 4 is a diagram corresponding to the FIG. 2 diagram which portrays the reflection characteristics of the FIG. 3 SWIF device as function of frequency. Again, as in FIG. 2, four curves are shown, representing reflection characteristic of a SWIF transducer with transducer finger duty factors of 10 percent, 20 percent, 50 percent and 75 percent, terminated by a relatively high impedance. It can clearly be seen that for relatively high, primarily resistive loads, surface wave reflections are minimized at relatively low finger duty factors. The FIG. 3 device is illustrated to have input and output transducer combs having a finger duty factor of approximately 25 percent.

A general statement can be made on the relationship between transducer finger duty factor and surface wave reflections which holds for interdigital-type surface wave transducers of the general nature described in the frequency range discussed. For primarily resistive applied loads, the surface wave reflection coefficient of transducers is inversely related to the magnitude of the load applied across the transducer relative to the driving point impedance of the transducer. The term "inversely related" is not herein intended to imply linearity, but is intended to comprehend the more general relationship of a decreasing dependent variable for increasing independent variable (or vice versa).

It can be seen from both FIGS. 2 and 4 that a transducer having a finger duty factor of 50 percent, as employed in prior art SWIF devices, has a relatively high reflection characteristic for both relatively high and relatively low applied loads.

The close interrelationship between transducer finger duty factor, applied load impedance, and the magnitude of wave reflections is further evidenced by the additional experimental data plotted in FIGS. 5A–5I and shown in the below transducer driving point impedance table wherein the effect of reactive, as well as resistive, loads is exhibited. The data for the FIGS. 5A–5I plots and the table was developed using a transducer designed for a center frequency of 42 MHz disposed on a Y-cut lithium niobate medium adapted for wave propagation along the Z axis of the crystal. The transducer had 10 finger pairs, each with an active length of 100 mils.

| D% | Impedance of Comb=Z | | | | | f |
|---|---|---|---|---|---|---|
| | Z | −θ | R | −jX | c (pf) | MHz |
| | 600 | 82 | 83 | 594 | 6.7 | 40 |
| | 610 | 74 | 168 | 586 | 6.6 | 41 |
| 20 | 700 | 68 | 262 | 649 | 5.8 | 42 |
| | 790 | 72 | 244 | 751 | 4.9 | 43 |
| | 810 | 78 | 168 | 792 | 4.6 | 44 |
| | 370 | 80 | 64 | 363 | 11 | 40 |
| | 390 | 68 | 146 | 362 | 10.7 | 41 |
| 50 | 480 | 60 | 240 | 416 | 9.1 | 42 |
| | 580 | 67 | 227 | 534 | 6.9 | 43 |
| | 610 | 74 | 168 | 586 | 6.2 | 44 |
| | 265 | 80 | 46 | 261 | 15.2 | 40 |
| | 275 | 72 | 85 | 262 | 14.8 | 41 |
| 75 | 300 | 66 | 122 | 274 | 13.8 | 42 |
| | 345 | 68 | 129 | 320 | 11.6 | 43 |
| | 395 | 73 | 115 | 378 | 9.6 | 44 |

The above table describes the driving point impedance characteristic for a transducer in polar coordinates $(Z,\theta)$ and rectangular coordinates $(R,-jX)$ for finger duty factors of 20 percent, 50 percent and 75 percent in the frequency range 40–44 MHz. The capacitance C of the transducer in pico-farads is tabulated in the fifth column.

The FIGS. 5A–5I plots and the table support the above statements regarding the interrelationship of finger duty factor, applied load or source impedance, drivng point impedance of the transducer, and the magnitude of wave reflections. It appears that a number of different reflection mechanisms exist, and for this reason it is difficult to generalize the reflection behaviors for all duty factors and all load conditions.

It can be seen from the FIGS. 5A–5I that a capacitive termination of a 25 percent duty factor transducer yields the lowest values for minimum and maximum reflection coefficient. It is also noted that the highest reflection coefficient is obtained when the transducer capacitance resonates with an inductance; an inductive termination for 75 percent duty factor transducer fingers yields the highest reflection coefficient (.75).

It is an aspect of this invention to take advantage of the discovered reflection maximization technique to provide an optimally efficient surface wave reflection. By providing a high finger duty factor, and a correspondingly low transducer driving point impedance, in combination with an inductive load tuned to resonate with the capacitance of the comb, surface wave reflections are maximized. Such inductively loaded transducer structures are expected to find utility in such applications as surface wave reflectors, and two-port SWIF resonators (such as depicted, for example, in U.S. Pat. No. 3,582,837).

It has been seen from the above discussion and experimental data that the surface wave reflection coefficient of a surface wave transducer of the interdigitated combed type is a function of the transducer finger duty factor and of the relationship between the driving point impedance of the transducer and the impedance of the load or source applied across the transducer. This knowledge is utilized to advantage in a SWIF device, shown in FIG. 6, for minimizing wave reflections and overall losses which is adapted to be coupled between separate input and output impedances.

Figure 6:
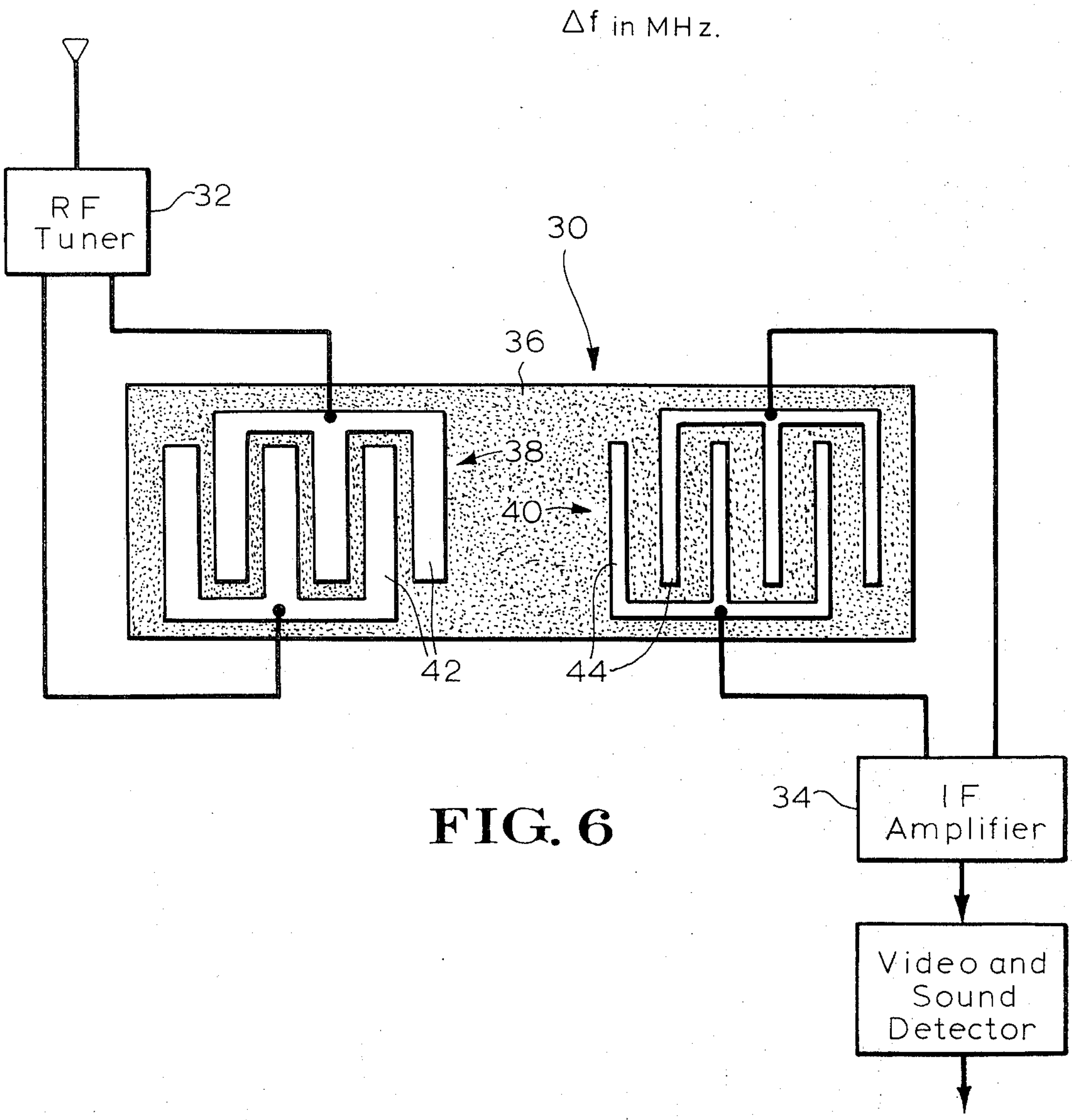
FIG. 6 is a view of a SWIF device constructed according to this invention which has impedance coupling or relating properties also minimizing surface wave reflections in the device.
Figures 5A, 5B, 5C, 5D, 5E, 5F, 5G, 5H, 5I:
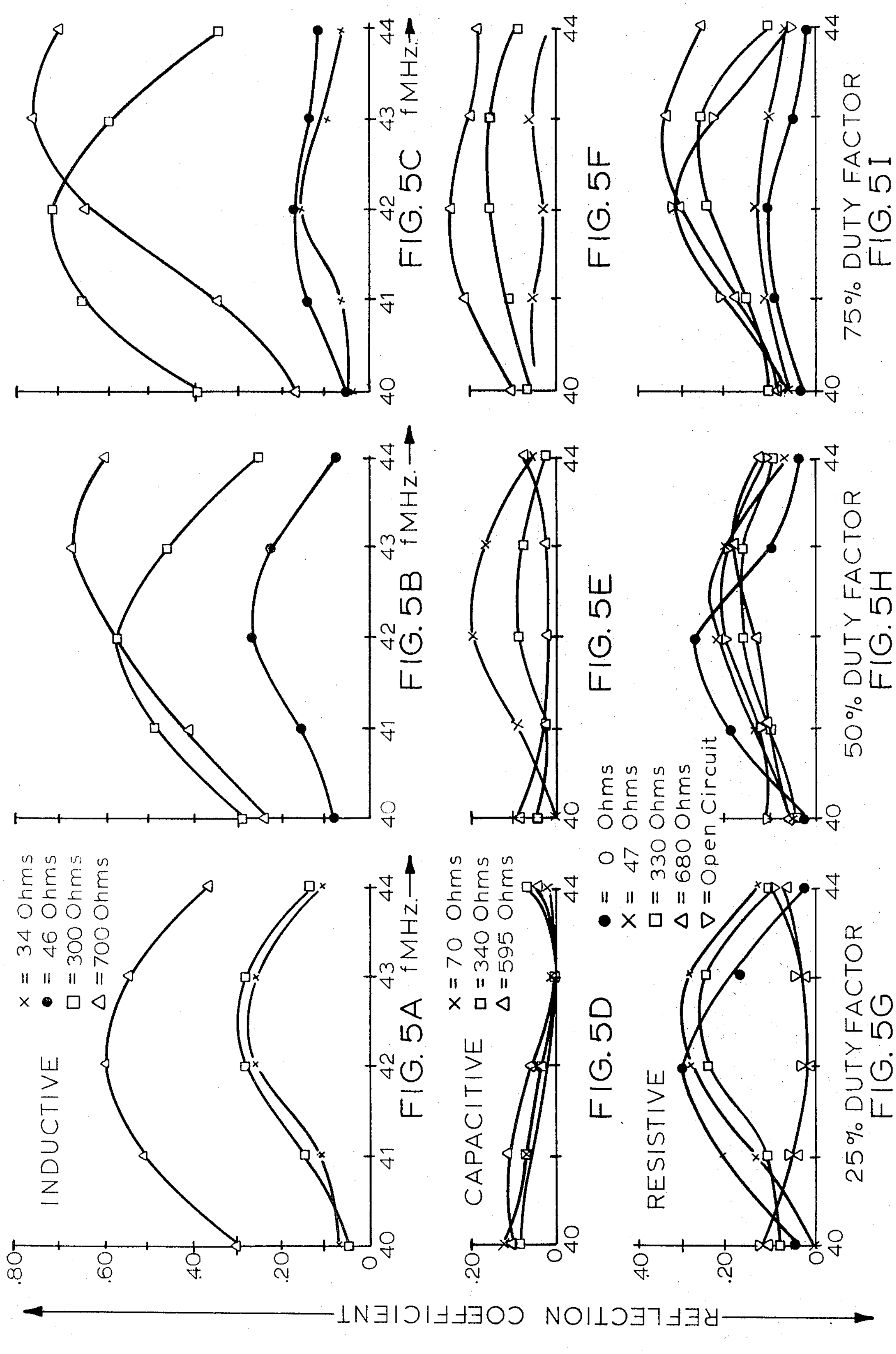
FIGS. 5A–5I are diagrams each containing a family of curves depicting the wave reflection characteristics of surface wave filter devices according to this invention for inductive, capacitive and resistive loads at different transducer finger duty factors.

FIG 6 illustrates a system including a SWIF device 30 depicted for use in the IF stage of a television receiver. The SWIF device 30 is coupled between an RF tuner 32 and an IF amplifier 34. The SWIF device 30 is shown as including a piezoelectric wave-propagative medium 36 on which is disposed a transmitting transducer 38 for launching surface waves along the medium 36 and a receiving transducer 40 for receiving the surface waves launched by the transmitting transducer 38.

It is well known that power transfer between a source and a load is optimized by effecting an impedance match between the source and the load. Applying this optimum power transfer principle to the FIG. 6 device might suggest that a finger duty factor for the transducer 38 should be selected which establishes a driving point impedance which is matched as closely as possible to the output impedance of the tuner 32. However, as may be well appreciated from the above discussion, power loss is but one factor to be considered in the design of a SWIF device. In most SWIF device applications, at least those in which the wave propagative medium is not highly lossy, a more important consideration is the reflection coefficient of the SWIF transducers. The teachings of this invention make possible an optimal performance trade-off between power transfer losses (due to impedance mismatching) and degradation due to wave reflections. In some cases, reflection minimization and power transfer can be concomitantly maximized by selection of an optimum finger duty factor value, obviating the need for trade-off considerations.

The RF tuner of a television receiver typically has a relatively low output impedance, for example, 150 ohms. In order to optimize the impedance relationship between the relatively low output impedance tuner 32 and the driving point impedance of SWIF device 30, a duty factor is selected for the fingers 42 of the input transducer 38 which is relatively high, preferably 75–85 percent, thus establishing a relatively low driving point impedance for the input transducer 38.

For a 75 percent finger duty factor and at 42 MHz, the driving point impedance of the tranducer 38 is approximately 300 ohms (reactive). Although the finger duty factor of interdigital type transducers of the nature described can be increased above 75 percent to approximately 80–85 percent, it can be stated that even for a maximized finger duty factor value, an impedance mismatch, and consequent above-minimum power transfer losses, are unavoidable. For low terminal impedance applications, as described, finger duty factors in the range of 70–80 percent are preferred. It is important to note that by selecting a high value for finger duty factor according to this invention, the reflection coefficient and the power transfer factor are both significantly improved over what they would be if a 50 percent duty factor, as taught by the prior art, were used.

The above-described principles are also similarly utilized for optimally interrelating the driving point impedance of the output transducer 40 to the input impedance of the IF amplifier 34. The input impedance of a typical IF amplifier used in present commercial television receivers is relatively high by comparison with the output impedance of a conventional RF tuner — a typical input impedance for an IF amplifier is in the order of 1,000 ohms. In order to minimize wave reflections from the output transducer 40 while maximizing, as nearly as possible the power transfer losses, the duty factor of the fingers 44 of the output transducer 40 is selected to be realtively low, resulting in a relatively high driving point impedance of the output transducer 40.

The Driving Point Impedance Table shows a transducer impedance for 25 percent finger duty factor at 42 MHz to be 700 ohms (reactive). This figure compares favorably with 1,000 ohms in terms of acceptable power transfer losses. It can be deduced from FIG. 5G that in the frequency range of interest a very low reflection coefficient characteristic will also be provided by a transducer with a low finger duty factor terminated by a primarily resistive load in the order of 1,000 ohms magnitude. Further improvements in power transfer and reflection minimization would follow the use of even smaller finger duty factors; however, physical limiations, fabrication difficulties and conversion losses militate against the use of finger duty factors below 10 percent. For high terminal impedance applications, as described, finger duty factors in the range of 10–30 percent are preferred.

By this invention, then, an acoustic surface wave device is provided having transmitting and receiving transducer means, the respective duty factors of the fingers of the transducer means being selected as to minimize reflections while maximizing power transfer between the tuner and the IF amplifier.

In certain signal processing applications it may be more desirable to have uniformity in reflection coefficient as a function of frequency than minimized reflections. I have discovered that for a particular wave propagative medium and frequency range of interest, there may be a narrow range of finger duty factors in which the reflection coefficient as a function of frequency is relatively constant.

Figure 7:
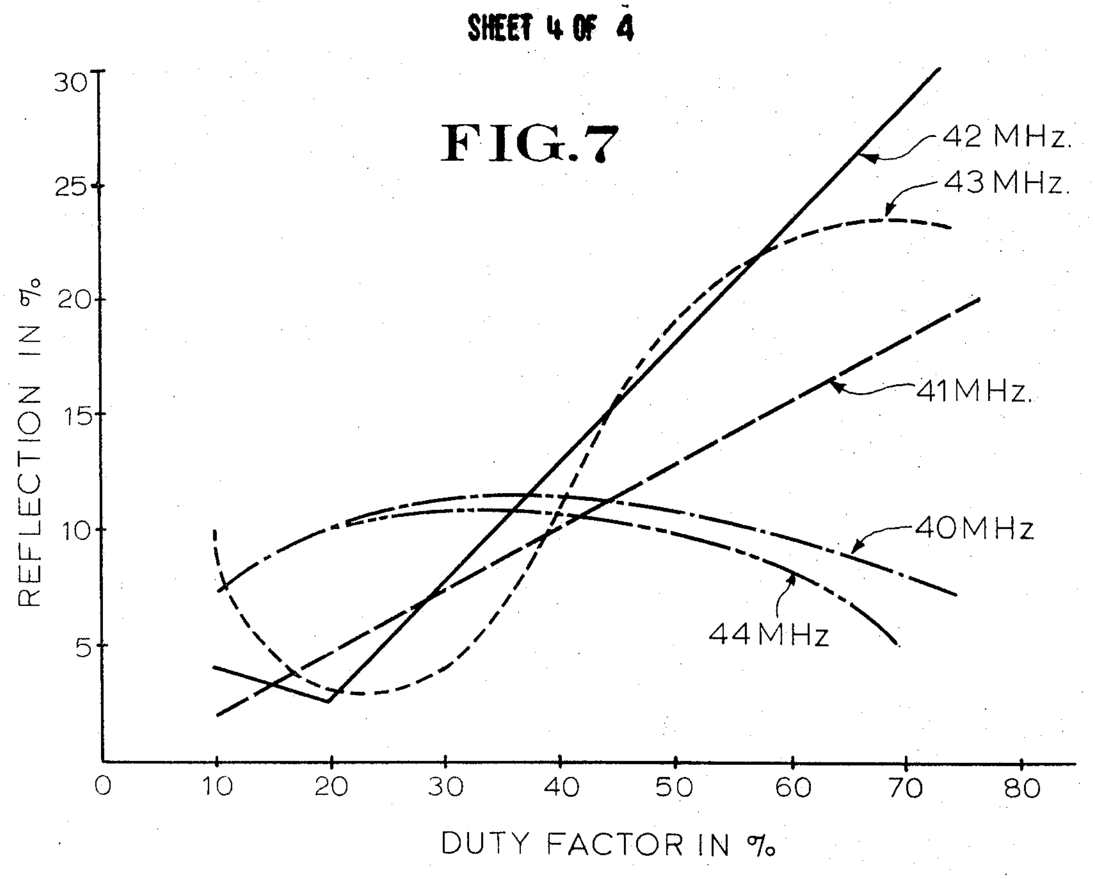
FIG. 7 is a diagram containing a family of curves which depicts for signals of different frequencies the manner in which surface wave reflections vary as a function of transducer finger duty factors.

FIG. 7 depicts a family of curves representing, for a number of different frequencies in the frequency range of interest, variation in reflection coefficient as a function of finger duty factor. The family of curves in FIG. 7 was developed using a Y–Z lithium niobate substrate on which was disposed a 10 finger pair transducer terminated by a relatively high impedance load. It can be seen from FIG. 7 that, whereas the shape of the curves in the family varies widely, indicating that reflection characteristics may vary widely with frequency, there nevertheless exists a narrow range of finger duty factors, centering on approximately 35–45 percent, centered at 40 percent, at which the curves cross. Thus for applications where uniformity of reflection coefficient for a range of frequencies is of paramount importance, a duty factor in this range (35–45 percent) may be selected.

Utilizing the discoveries I have made on effects of finger duty factor on variation of wave reflections with signal frequency, the following method may be employed in the fabrication of surface wave devices for use in applications where uniformity of wave reflections for all frequencies of interest is of great importance.

The method comprises: first, for a given wave propagative medium and load applied, determine the variations in a reflection characteristic (such as reflection coefficient) of the tested transducer as a function of the duty factor of the transducer fingers for each of a plurality of frequencies spaced across a frequency range of interest. Second, utilize the determinations of variation in the reflection characteristic to ascertain an optimum finger duty factor having minimized variation in reflection characteristics across the said frequency range. Third, during the fabrication of the SWIF device, cause the duty factor of the fingers of at least the output transducer to have the said optimum duty factor.

It is a stated object of this invention to provide improved surface wave filter devices in which the velocity of surface wave propagation can be predetermined with a high degree of accuracy. It is known that the velocity of propagation of surface waves on a particular wave propagative medium is determined primarily by the density, elastic, dielectric and piezoelectric constants of the medium. However, it has also been recognized that the velocity of surface wave propagation is influenced by the presence of an electrically conductive coating on the wave propagative surface. It has been shown by Campbell and Jones in The IEEE Trans. Sonics and Ultrasonics, vol. SU-15, pp. 209–217, October 1968, that the propagation velocity of surface waves on a surface of a lithium niobate crystal is reduced if the surface is metalized. The referenced publication reports a surface wave propagation velocity on a free surface of lithium niobate of 3,488 meters per second. By contrast, the authors calculated a lower propagation velocity of 3,404 meters per second on the same medium having a conductive overlayer.

In accordance with one aspect of this invention, I have found that the constructive velocity (defined below) of surface waves propagating on a medium can be predicted and specified very accurately by selecting according to a specific prescription the duty factor of the fingers of a surface wave transducer.

The term "constructive velocity" $V_c$, as applied to surface waves generated by interdigital-type transducers, is herein defined as: $V_c = f_c\lambda$, where $f_c$ is the center (synchronous) frequency of the transducer and $\lambda$ is the wavelength of the surface waves generated as determined by the period ("P" in FIGS. 1 and 3) of the transducer fingers. Because the center frequency $f_c$, i.e., the frequency of maximum response of the transducer, is subject to variation in practice, especially for high coupling materials, the frequency of the first low frequency null $f_{min}$, being free from spurious modes is used to determine $f_c$ as follows:

$$f_0 = \frac{f_{\min}}{\left(1-\frac{1}{N}\right)},$$

where N represents the number of finger pairs in the transducer.

I have discovered that the constructive velocity of surface waves generated by an interdigital-type transducer is inversely proportional to the duty factor of the transducer fingers. To a first approximation the relationship has been found to be linear. In accordance with an aspect of this invention, the duty factor $D_s$ of the transducer fingers may be selected substantially in accordance with the following relationship so as to produce a desired wave constructive velocity $V_c$:

$$D_8 = V_f - V_c/V_f - V_{sc},$$

where $V_f$ represents the propagation velocity of surface waves on a free surface of the medium, and $V_{sc}$ represents the propagation velocity of surface waves on the medium when the surface thereof is fully short-circuited, as by total metalization.

Figure 8:
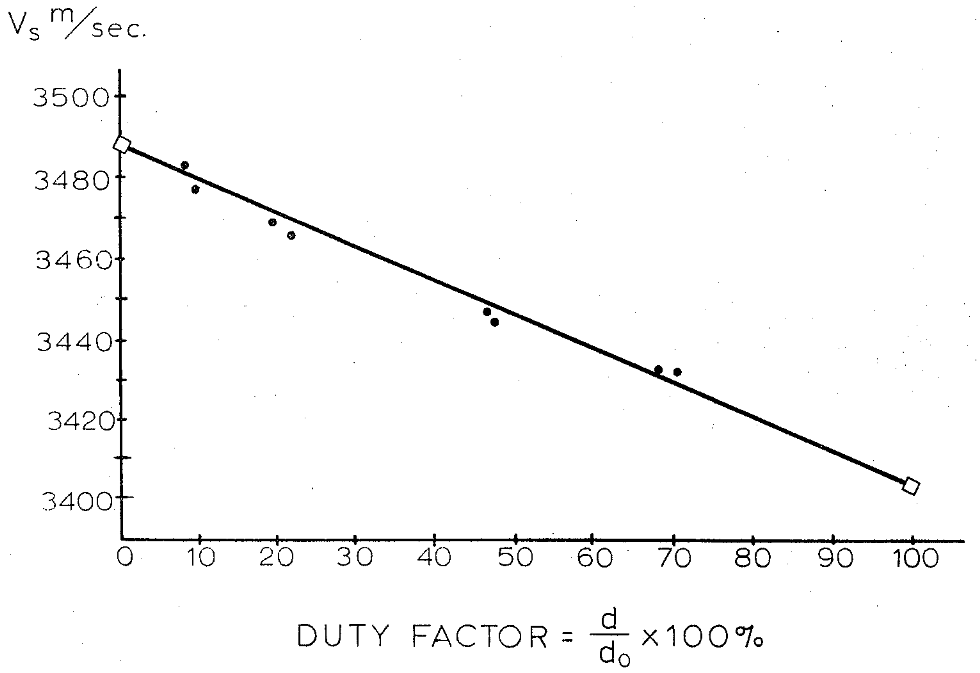
FIG. 8 is a diagram illustrating the manner in which the constructive velocity (defined below) of a surface wave device on a lithium niobate medium varies as a function of transducer finger duty factor.

FIG. 8 is a diagram showing the results of actual tests made with a number of surface wave transducers of the general type shown in FIG. 1 using as a piezoelectric wave propagating medium a crystal of Y-cut lithium niobate, the surface of propagation being arranged such that the wave propagation if along the Z axis of the crystal. The transducer synchronous frequency was 42 MHz and was measured under open circuit conditions.

It can be seen then that by this aspect of the invention, a predetermined surface wave constructive velocity can be selected with a high degree of accuracy.

It is yet another above-stated object of this invention to provide improved SWIF devices having minimized insertion loss. I have discovered that the surface wave coupling factor for surface wave transducers of the above-described type varies as a function of the duty factor of the transducer fingers. More specifically, over a large range of finger duty factors (approximately 10–80 percent), the coupling factor has been found to vary directly as the duty factor, higher duty factors yielding higher coupling factors and hence lower insertion losses for the embodying SWIF devices.

The experimental results disclosed in this application are for Y-cut Z propagative lithium niobate. The combs are made of aluminum with film thickness of 3,000 A. The active length of the comb was 100 mils and the number of transducer sections were 10. The principles of this invention, however, may be applied to surface wave devices having other constructions, constituent materials and design and operating parameters. For example, the above-described reflection minimization teachings may, as intimated, also be applied to two port as well as to the four port devices as described in detail above. Changing the length or the number of transducer sections will change the driving point impedance of the comb. The absolute value of the load impedance for optimum suppression is a function of the driving point impedance of the comb.

The invention is not limited to the particular details of construction of the embodiments depicted and other modifications and applications are contemplated. Certain changes may be made in the above described methods and apparatus without departing from the true spirit and scope of the invention herein involved and it is intended that the subject matter in the above depiction shall be interpreted as illustrative and not in a limiting sense.

I claim:

1. An acoustic surface wave device having minimized surface wave reflections and overall loss, comprising:

a piezoelectric surface wave propagative medium having a surface for propagating surface waves;

transmitting transducer means and receiving transducer means spaced on said surface of said medium for respectively launching and receiving surface waves on said medium, said transmitting and receiving transducer means each including an array of spaced, electrically conductive fingers, the width of which, for any given spacing, determines the duty factor of said transducers;

means for coupling said transmitting transducer means to a source of electric input signals; and means for coupling said receiving transducer means to a predetermined load, said duty factor of at least one of said transducer means being selected to be substantially 75 percent for a coupled source or load of low relative impedance and alternately to be substantially 25 percent for a coupled source or load of high relative impedance so as to minimize wave reflections and overall loss from said surface wave device.

2. An acoustic surface wave device as in claim 1, wherein the impedances of said source of electric input signals and said predetermined load differ, and wherein one of said transducers has a 75 percent duty factor and the other has a 25 percent duty factor to maximize power transfer between said source and said load impedance and minimize wave reflections of said device.

3. An acoustic surface wave device as in claim 2, wherein said source of electric input signals comprises a relatively low output impedance television tuner and said predetermined load comprises a relatively high input impedance television IF amplifier.

4. A surface wave transmitter, comprising:

a piezoelectric surface wave propagative medium having a surface for propagating surface waves; and transducer means for launching surface waves on said surface of said medium at a selected constructive velocity $V_c$, including an array of spaced, electrically conductive fingers disposed on said surface, said fingers having a duty factor $D_8$ selected substantially in accordance with the following relationship so as to produce said wave velocity $V_c$:

$$D_8 = V_f - V_c/V_f - V_{sc}$$

where $V_f$ is the free propagation velocity of surface waves on said medium, and $V_{sc}$ is the propagation velocity of surface waves on said medium when said surface is fully short-circuited.

5. An acoustic surface wave device having minimized variation in surface wave reflections as a function of frequency, comprising:

transmitting transducer means and receiving transducer means spaced on said surface of said medium for respectively launching and receiving surface waves on said medium, said transmitting and receiving transducer means each including an array of spaced, electrically conductive fingers;

means for coupling said transmitting transducer means to a source of electric input signals; and means for coupling said receiving transducer means to a load, having a resistive impedance which is substantially greater than the driving point impedance of said receiving transducer means, said device being characterized by having the duty factor of said fingers of at least said receiving transducer means selected from the range of about 35 percent to 45 percent.

6. For use in a fabrication of a surface wave integratable filter device having in spaced relationship on a piezoelectric surface wave propagative medium input and output transducer means of the type comprising interdigitated arrays of electrically conductive fingers, a method for minimizing frequency-dependent variations in the reflection coefficient of the transducer means, comprising:

for a given wave propagative medium and applied load across said output transducer, determining variations in said reflection coefficient of said transducer means as a function of the duty factor of said transducer fingers for each of a plurality of frequencies spaced across a frequency range of interest;

utilizing the determinations of variation in reflection coefficient to select an optimum finger duty factor yielding minimum variation in reflection characteristic across said frequency range; and during fabrication of said device, causing the duty factor of the fingers of at least said output transducer means to have said optimum duty factor.

* * * * *